United States Patent [19]
Miyashita

[11] Patent Number: 5,430,326
[45] Date of Patent: Jul. 4, 1995

[54] SEMICONDUCTOR DEVICE FOR MOUNTING ON A PRINTED WIRING BOARD

[75] Inventor: Shuji Miyashita, Nagano, Japan

[73] Assignee: Fuji Electric Co., Ltd., Kawasaki, Japan

[21] Appl. No.: 238,673

[22] Filed: May 5, 1994

Related U.S. Application Data

[62] Division of Ser. No. 82,757, Jun. 25, 1993.

[30] Foreign Application Priority Data

Jun. 26, 1992 [JP] Japan .................. 4-168040

[51] Int. Cl.⁶ .................. H01L 25/065; H01L 23/48
[52] U.S. Cl. .................. 257/690; 257/724; 257/691; 361/735; 361/760
[58] Field of Search .............. 257/573, 584, 587, 678, 257/691, 698, 700, 723, 724, 690; 361/728, 735, 744, 760, 784, 785, 792; 439/44, 45, 74, 75

[56] References Cited

U.S. PATENT DOCUMENTS 4,885,629 12/1989 Takagi .................. 257/690

FOREIGN PATENT DOCUMENTS 0015452 1/1982 Japan .................. 257/690
0237750 10/1987 Japan .................. 257/690
7900817 10/1979 WIPO .................. 257/690

OTHER PUBLICATIONS

IBMTDB, Doo, V. Y., Liquid Metal Multihead Connector vol. 20, No. 11B, Apr. 1978, pp 4789–4790.

*Primary Examiner*—William Mintel
*Assistant Examiner*—Peter Toby Brown
*Attorney, Agent, or Firm*—Braumbaugh, Graves, Donohue & Raymond

[57] ABSTRACT

A semiconductor device includes at least one semiconductor element contained in a casing, with main terminals and auxiliary terminals drawn from the semiconductor electrodes disposed on the upper face of the casing. The main terminals and the auxiliary terminals are arranged on the same plane at the same height without disposing partitions between the terminals so that the devices can be mounted on a printed wiring board on which the necessary conductor patterns for the main circuit have already been formed. In an alternative embodiment, the main terminals are arranged at a level slightly higher than the auxiliary terminals with the auxiliary terminals being surrounded by a supporting guide.

6 Claims, 3 Drawing Sheets

SEMICONDUCTOR DEVICE FOR MOUNTING ON A PRINTED WIRING BOARD

This application is a division of application Ser. No. 8/082,757, filed on Jun. 25, 1993.

BACKGROUND OF THE INVENTION

The present invention relates to a configuration for a semiconductor device intended for a power transistor module used with an inverter.

These days, power transistor modules with diverse specifications and configurations used in the field of power electronics are produced commercially. FIGS. 6 and 7 show examples of conventional power transistor modules, FIG. 6 showing a one-set module, and FIG. 7 showing a two-set module,—the appearance of the modules is shown in FIGS. 6(a) and 7(a) and the internal circuitry is shown in FIGS. 6(b) and 7(b). Actual products use the transistors in Darlington connection and contain high-speed diodes for free wheeling between a collector and an emitter. FIGS. 6 and 7 show a resin made case 1, a metallic base plate 2, main terminals 3 for a collector terminal C and an emitter terminal E, auxiliary terminals 4 for drive signal input, and case fixing screw holes 5 disposed at the four corners of the case 5, wherein the main terminals 3 and the auxiliary terminals 4 are disposed on the top face of the case 1, and the auxiliary terminals 4 are arranged on a parallel level of the upper face one step lower than the main terminals 3.

In the structure shown in FIG. 6, a partition 1a is disposed between the main terminals 3 to ensure a sufficient insulation creepage distance. In contrast, the structure in FIG. 7 has grooves formed among the main terminals 3. When assembling circuits such as for an inverter combining two or more transistor modules with the above structures, the transistor modules are either interconnected in series or parallel by connecting the main terminals with busbars.

Recent trends in manufacturing products such as inverters are popularizing a method of assembling products using automatic mounting in assembly lines. Printed wiring boards are being used in place of conventional busbars to interconnect transistor modules in order to simplify the assembly process. To explain, mounting transistor modules on a printed wiring board on which the necessary conductor patterns for the main circuit have already been formed can greatly reduce the number of parts and the worker man-hours compared with a busbar wiring system. For example, a snubber circuit and a control circuit can be mounted on the printed wiring board at the same time using a printed wiring board enabling products to be made more compact.

However, the following problems need to be solved for transistor modules of conventional structure, shown in FIGS. 6 and 7, when a printed wiring board is used for wiring the modules. That is, in the conventional structures of FIGS. 6 and 7, the height of the main terminals 3 and the auxiliary terminals 4 are different, and in the structure of FIG. 6 the partition 1a protrudes from between the main terminals 3, whereby the printed wiring board 8 cannot be mounted close to the casings of the transistor modules because the partition 1a works as an obstacle, and the printed wiring board cannot be connected directly to the terminals by means of screwing.

Another problem is that while the case fixing screw holes 5 are disposed at the four corners of the case 1 in the conventional structures, if the holes must be reduced to two, the auxiliary terminals 4 standing in a lateral line on the edge of the case 1 as in FIG. 7(a) form an obstacle and make disposing screw holes with the same diameter as the conventional holes on the center of both edges of the case 1 difficult in terms of dimensional restriction. The present invention has been made in light of these problems, and its objective is to solve said problems and provide a semiconductor module with good assembling workability suitable for mounting on a printed wiring board employed for interconnecting the modules when assembling inverter circuits using two or more transistor modules.

SUMMARY OF THE INVENTION

The above objectives are achieved by constructing a semiconductor module as follows. In a first embodiment, a semiconductor device includes one semiconductor element contained in a case, with main terminals and auxiliary terminals drawn from the semiconductor electrodes disposed on the upper face of the case. The main terminals and the auxiliary terminals are arranged on the same plane at the same height without disposing partitions between the terminals so that the transistor modules can be mounted on a printed wiring board on which the necessary conductor patterns for the main circuit have already been formed. In an alternative embodiment the auxiliary terminals are drawn from a level below that of the main terminals on the upper face of the case. In this embodiment, the auxiliary terminals are surrounded by a supporting guide of a height which adds support to the printed wiring board to which the semiconductor device is mounted.

BRIEF DESCRIPTION OF THE DRAWINGS

Other objects, features and advantages of the invention will become apparent, and its construction and operation better understood, from the following detailed description when read in conjunction with the accompanying drawings, in which.

DETAILED DESCRIPTION OF THE PREFERRED EMBODIMENTS

Figure 1:
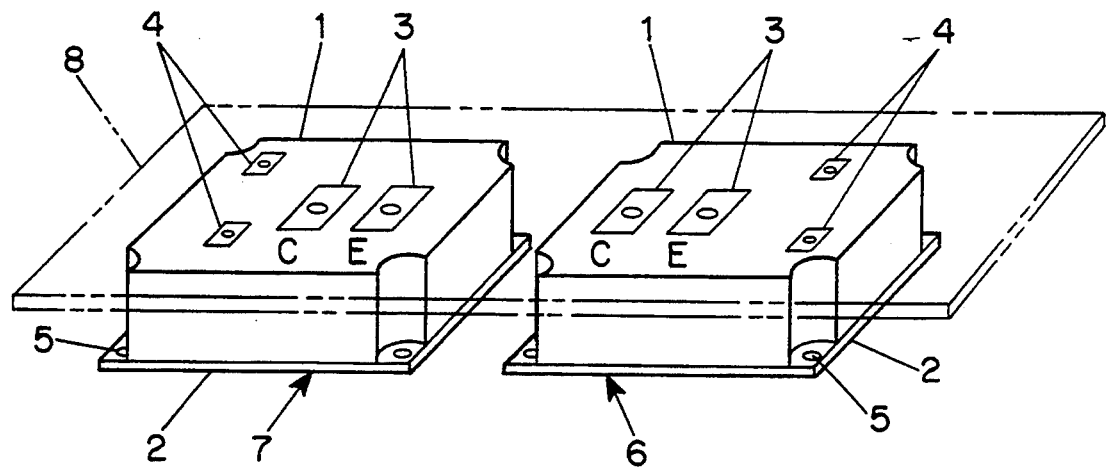
FIG. 1 is a perspective view of a semiconductor device corresponding to a first embodiment of the present invention.

In a semiconductor device comprising one set of semiconductor elements contained in a case, with main terminals and auxiliary terminals disposed on the upper faces of the case, connected to and drawn from electrodes in the semiconductors, the main terminals and the auxiliary terminals are arranged on the same plane at the same height without disposing partitions between the terminals.

According to this structure, printed wiring boards, or any planar conductor, can be directly mounted on the cases, and the main terminals and the auxiliary terminals can be connected directly with conductor patterns formed on the printed wiring boards by screws. Further, if such semiconductor devices are used in sets of two and interconnected in series to structure a bridge arm for an inverter, an emitter terminal in one of the transistors and a collector terminal in the other transistor can be wired with a minimum wiring length by means of arranging in reverse the main terminals disposed in each semiconductor device, for example, the collector terminal and the emitter terminal in the power transistors, with the advantage that wiring inductance can be reduced.

In another embodiment, the semiconductor device comprises two or more sets of semiconductors contained in each case, with main terminals and auxiliary terminals disposed on the upper face of the case connected to and drawn from electrodes in the semiconductors. The main terminals are arranged at the center of the top of the case in one row and at the same height and the auxiliary terminals are concentrated at the side of the main terminals. By adopting the configuration described above, it is possible to ensure that the case fixing screw holes are reduced to two at the center of both edges of the case.

In another embodiment, a semiconductor device comprises at least one set of semiconductor elements in a case, with the main terminals and auxiliary terminals disposed on the upper face of the case connected to and drawn from electrodes in the semiconductor. The main terminals are arranged at the same height, and the auxiliary terminals are concentrated and drawn upward to the case from a position lower than the upper face of the main terminals. A supporting guide for supporting printed wiring boards laid at the same height with the main terminals is disposed around the auxiliary terminals. The supporting guide fills any space between the level of the upper face of the case where the auxiliary terminals emerge and the printed wiring board and/or any connector attached thereto used to interconnect the auxiliary terminals with the board. Therefore, when the printed wiring board is mounted on the case of the semiconductor device and the connectors attached to the printed wiring board are connected to the auxiliary terminals in the semiconductor device, it is possible to support the printed wiring board stably because the supporting guide disposed on the semiconductor device case carries the printed wiring board from below, with the advantage that stress imposed on the printed wiring board can be reduced. The printed wiring board is also supported by a supporting guide and a connector attached beneath the printed wiring board. The supporting guide has a height equal to the difference between the space under the printed wiring board and the height of the connector.

Figure 6A:
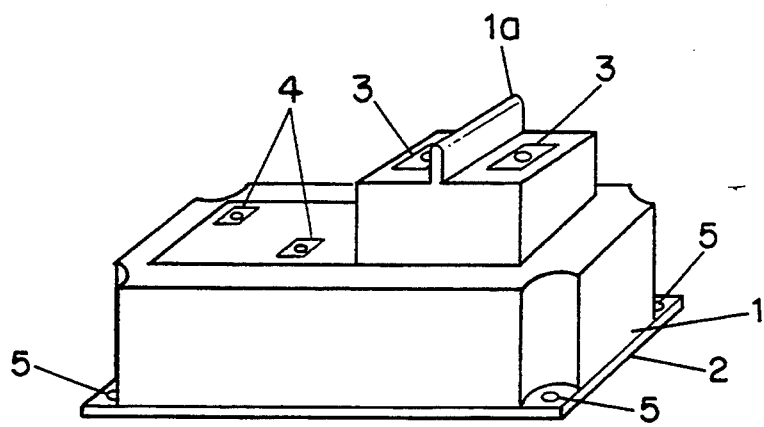
FIG. 6(a) is a perspective view of a conventional one-transistor semiconductor module FIG. 6 (b) is an schematic circuit diagram representative of the module shown in FIG. 6(a) and representative of one of the transistors in the device of FIG. 1.
Figure 6B:
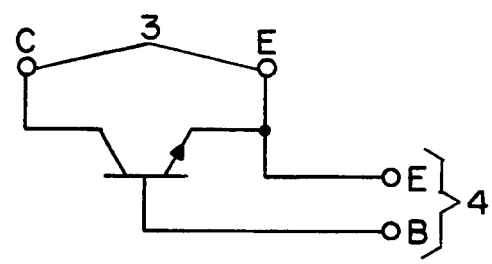
Figure 7A:
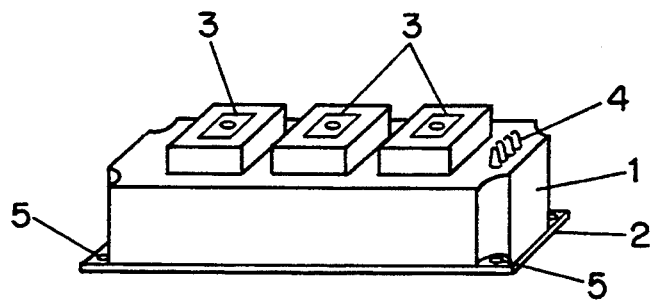
FIG. 7(a) is a perspective view of a conventional two-transistor semiconductor module.

Explanations are given hereafter with reference to the drawings. Parts common to each of the embodiments shown in FIGS. 6 and 7 are given the same numeral. FIG. 1 shows a first embodiment of the present invention, wherein two power transistor modules 6 and 7 of the same technical specification, containing one transistor each of the type shown in FIG. 6(b), are arranged side by side. The modules are wired in series via conductor patterns on a printed wiring board 8 spanning over the modules to structure a bridge arm in an inverter. In this embodiment, the cases 1 for the modules 6 and 7 are constructed with a flat top face and have their main terminals 3 and auxiliary terminals 4 formed to have flat upper surfaces with screw holes and arranged on the same plane parallel to the top face at the same height. Module 6 has its terminals disposed on the case such that the main terminal 3 corresponding to the collector electrode C of the semiconductor device encased in the module 6 is closest to the edge of the module 6 which is adjacent to module 7. The main terminal 3 corresponding to the emitter electrode E is next to it and the auxiliary terminals nearer the far edge. Module 7, on the other hand, has the main terminal 3 corresponding to the emitter electrode E of the semiconductor device encased in the module closest to the edge of module 7 which is adjacent to module 6 with the main terminal 3 corresponding to the collector electrode C next to it and the auxiliary terminals nearer the far edge.

The printed wiring board 8 is fixed on top of the case 1 spanning over the power transistor modules 6 and 7 so that the main terminals 3 and the auxiliary terminals 4 can be screwed onto the conductor patterns on the printed wiring board 8. In addition, the two modules having the above-described reversed order of terminals from one another allows the collector terminal C on the module 6 and the emitter terminal E on the module 7 to be connected in series with minimum wiring distance via the conductor patterns on the printed wiring board 8. This structure can reduce wiring inductance.

Figure 2:
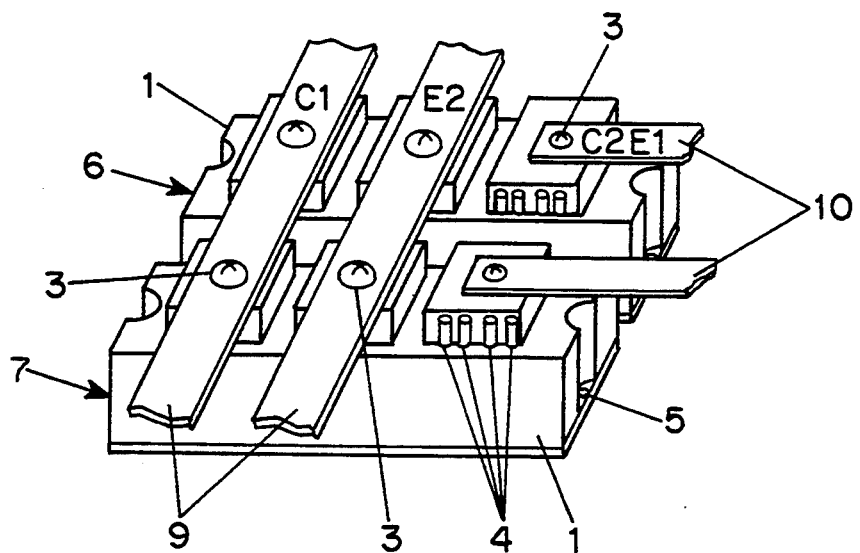
FIG. 2 is a perspective view of a semiconductor device corresponding to a second embodiment of the present invention.
Figure 7B:
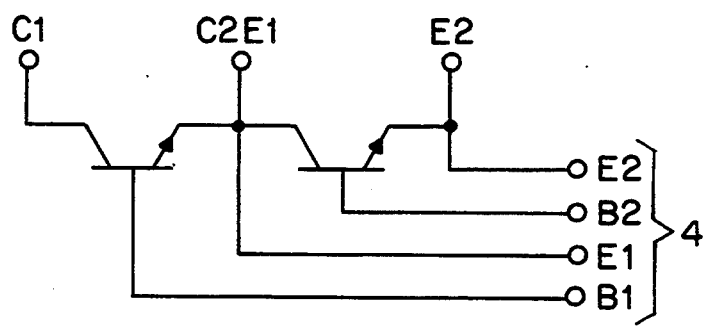
FIG. 7 (b) is an schematic circuit diagram representative of the module shown in FIG. 7(a) and representative of the two transistors in each module of the device of FIG. 2.

FIG. 2 shows a second embodiment of the present invention, wherein the power transistor modules 6 and 7 each contain two transistors as shown in FIG. 7(b). The modules 6 and 7 are disposed side by side and connected with busbars 9 wired across the collector terminal C1 and the emitter terminal E2 of the main terminals 3 of each of the modules 6 and 7, with the remaining output terminals C2E1 for each module connected to other parts of the circuit with busbars 10.

In this structure, the main terminals 3, including the collector terminal C1, the emitter terminal E2, and the output terminal C2E1, are arranged at the same height on the center of the top face of the case in one row from right to left, and the auxiliary terminals 4 are concentrated on the top face along the side of the main output terminal for C2E1 below the row of main terminals. Furthermore, in this embodiment, the case fixing screw holes are disposed in two places on both the right and left edges of the case 1 which are in line with the row of main terminals 3 at the center of both ends of the case 1. Since the auxiliary terminals 4 are disposed at a location off-center closer to the bottom edge of the top face of the case 1, the above screw holes 5 can be drilled without interference from the auxiliary terminals 4. This makes it possible to reduce the number of screw holes 5 from the four, which were drilled in the four upper corners of the case 1 in the structure shown in Fig. 7, to two.

Figure 3:
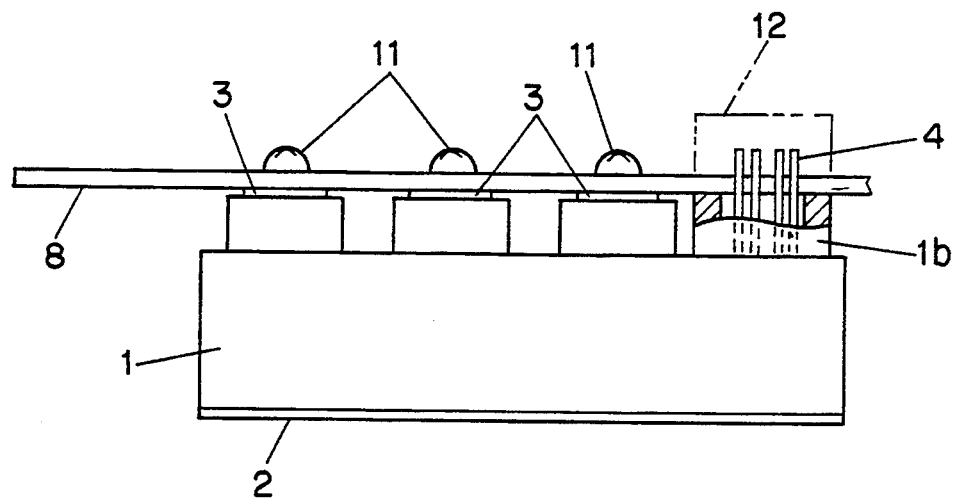
FIG. 3 is a side view of a semiconductor device corresponding to a third embodiment of the present invention.

FIG. 3 shows a third embodiment of the present invention. In this embodiment, the main terminals 3 are arranged at the same height on top of the case 1 of the power transistor module, and the printed wiring board 8 is directly mounted on the main terminals 3 and attached thereto with screws 11. The auxiliary terminals 4 are provided on the top face of the case 1 lower than the upper faces of the main terminals 3 so that they are concentrated at one end of the case top face in the same row as the main terminals and are drawn upward. The auxiliary terminals 4 are connected with the printed wiring board 8 by connector 12 attached on top of the printed wiring board 8.

Figure 5:
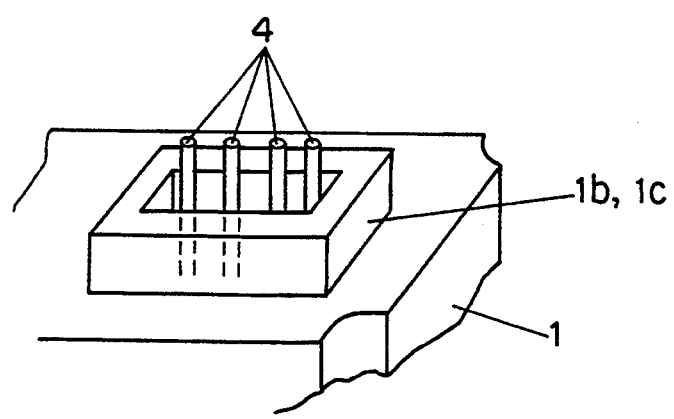
FIG. 5 is a perspective view showing the supporting guide in the embodiments illustrated in FIGS. 3 and 4.

In this structure, a supporting guide 1b for the printed wiring board 8 is disposed around the auxiliary terminals 4 to the same height as the main terminals 3 on top of the case 1. A perspective view of the supporting guide 1b is shown in FIG. 5. According to this structure, when the printed wiring board 8 is mounted on the main terminals 3, it is possible to ensure a stably fixed condition because the supporting guide 1b braces one end of the printed wiring board from below, enabling the stress imposed on the printed wiring board 8 to be reduced.

Figure 4:
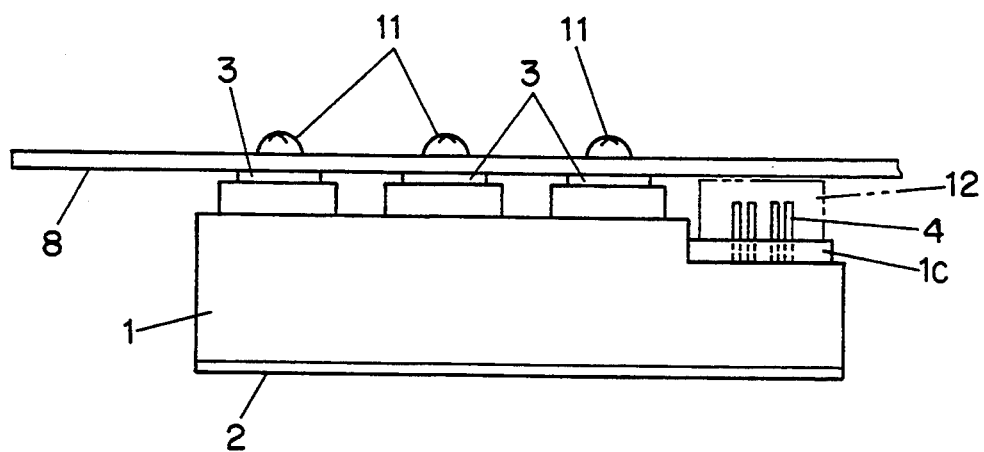
FIG. 4 is a side view of a semiconductor device corresponding to a fourth embodiment of the present invention.

FIG. 4 shows a fourth embodiment of the present invention. This embodiment is an application of the embodiment of FIG. 3 above, wherein the connector 12 interconnected with the auxiliary terminals 4 on the transistor module is fixed below the printed wiring board 8 and the auxiliary terminals 4 are disposed on a level on the upper face of the case lower than that on which the main terminals 3 are disposed. Further, in this embodiment a supporting guide 1c of lower height is disposed on the upper face of the case 1 surrounding the auxiliary terminals 4. This supporting guide 1c is set at the height of the main terminal 3 minus the height of the connector 12. When the printed wiring board 8 is disposed on the main terminals 3 directly contacting therewith, and the connectors 12 are linked with the auxiliary terminals 4 at the same time as shown, the bottom face of the connector 12 is braced on said supporting guide 1c. Thus, the printed wiring board 8 can be fixed stably on the transistor module similarly as described in Embodiment 3.

According to the configurations in the present invention as described above, external wiring in semiconductors for power transistor modules can be done easily and simply by replacing the conventional busbar wiring system with a printed wiring board. Moreover, by adopting the configurations set out above, a printed wiring board can be directly disposed on the terminals of a semiconductor, and the terminals can be interconnected with the conductor patterns on the printed wiring board. Thus, an automatic mounting assembly process can be adopted in an assembly process of a product such as an inverter, which can improve the mass-productivity of the product.

While the above is a description of the invention in its preferred embodiment, various modifications, alternate constructions and equivalents may be employed. Therefore, the above description and illustration should not be taken as limiting the scope of the invention which is defined by the appended claims.

I claim:

1. A semiconductor device adapted to be interconnected with planar conductor means having a connector of a predetermined height mounted on its bottom surface, the semiconductor device comprising:

a casing having an upper face and side faces, said upper face having a first level and a second level, said second level being lower than said first level;
   at least one set of semiconductor elements disposed within said casing, each semiconductor element of a set having two main electrodes and at least one auxiliary electrode for controlling a current flowing between the main electrodes;
   main terminals connected to one or more of main electrodes of said semiconductor elements, said main terminals emerging from said first level of said upper face of said casing and all terminating with respective ends disposed in a first common plane which is parallel to the first level of said upper face of said casing;
   auxiliary terminals connected to one or more of auxiliary electrodes and main electrodes of said semiconductor elements, said auxiliary terminals emerging from said second level of said upper face of said casing and all terminating with respective ends disposed in a second common plane which is parallel to the second level of said upper face of said casing; and
   a supporting guide having a predetermined height surrounding the area on said second level of said upper face of said casing where said auxiliary terminals emerge, the predetermined height being substantially equal to the difference between the predetermined height of the connector and the distance between the first common plane and the second level of said upper face of said casing so that the connector is supported by the supporting guide.

2. The semiconductor device of claim 1 wherein the planar conductor means comprises a printed wiring board.

3. A semiconductor device adapted to be interconnected with planar conductor means having a connector mounted on an upper surface thereof, the semiconductor device comprising:

a casing having an upper face and side faces;
   at least one set of semiconductor elements disposed within said casing, each semiconductor element of a set having two main electrodes and at least one auxiliary electrode for controlling a current flowing between the main electrodes;
   main terminals connected to one or more of main electrodes of said semiconductor elements, said main terminals emerging from said upper face of said casing and all terminating with respective ends disposed in a first common plane which is higher than and parallel to said upper face of said casing;
   auxiliary terminals connected to one or more of auxiliary electrodes and main electrodes of said semiconductor elements, said auxiliary terminals emerging from said upper face of said casing and all terminating with respective ends disposed in a second common plane which is parallel to said upper face of said casing; and
   a supporting guide having a predetermined height surrounding the area on said upper face of said casing where said auxiliary terminals emerge, the predetermined height being substantially equal to the difference between the first common plane and said upper face of said casing so that the supporting guide partially supports the planar conductor means disposed in said first common plane.

4. The semiconductor device of claim 3, wherein the planar conductor means comprises a printed wiring board.

5. A semiconductor device comprising:
- a casing having a planar upper face spaced a predetermined distance from a bottom face, and side faces;
- at least one set of semiconductor elements disposed within said casing, each semiconductor element of a set having two main electrodes and at least one auxiliary electrode for controlling a current flowing between the main electrodes;
- main terminals connected to one or more of main electrodes of at least one of said semiconductor elements and terminating at respective ends which are all disposed in a first common plane which is parallel to the upper face of said casing and free of barriers between said main terminals;
- auxiliary terminals connected to one or more of auxiliary electrodes and main electrodes of said at least one semiconductor element and concentrated in an area of the upper face of said casing located next to one of said main terminals and terminating at respective ends which are all disposed in a second common plane which is parallel to said first common plane;
- planar conductor means disposed in said first common plane for selectively interconnecting the ends of said main terminals;
- a connector for making connection to said auxiliary terminals, said connector having a planar upper surface disposed parallel to the upper face of said casing, and being mounted on the bottom surface of said planar conductor means; and
- a supporting guide surrounding said auxiliary terminals dimensioned to urge the planar upper surface of said connector against said planar conductor means.

6. The semiconductor device of claim 5, wherein the planar conductor means comprises a printed wiring board.

* * * * *